United States Patent [19]

Saxe et al.

[11] Patent Number: 4,621,217

[45] Date of Patent: Nov. 4, 1986

[54] ANTI-ALIASING FILTER CIRCUIT FOR OSCILLOSCOPES

[75] Inventors: Charles L. Saxe, Beaverton; Roydn D. Jones, Aloha, both of Oreg.

[73] Assignee: Tektronix, Inc., Beaverton, Oreg.

[21] Appl. No.: 652,700

[22] Filed: Sep. 21, 1984

[51] Int. Cl.⁴ ............................................... H01J 23/34
[52] U.S. Cl. ....................................... 315/1; 307/521; 324/121 R; 328/151
[58] Field of Search ................... 315/1; 328/167, 151; 333/165, 166, 167; 307/521, 543; 324/121 R, 77 CS, 77 C, 77 B, 78 F

[56] References Cited

U.S. PATENT DOCUMENTS 3,172,053  3/1965  Ronzheimer ........................ 307/521
4,142,146  2/1979  Schumann ...................... 324/121 R
4,513,260  4/1985  Ragan .................................. 328/151

Primary Examiner—Harold Dixon
Attorney, Agent, or Firm—John P. Dellett

[57] ABSTRACT

A digital storage oscilloscope is provided with an anti-aliasing filter circuit utilizing a first plurality of switchable analog filters that bandwidth limit frequencies greater than half the oscilloscope's sampling frequency, and a digital transversal filter effective at lower sweep rates and sampling rates for also bandwidth limiting frequencies greater than half the sampling frequency. The digital transversal filter is controllable to provide a different band pass characteristic for different sweep and sample rates. Both the selection of filters and the control of the digital filter are responsive to the oscilloscope's selection of sweep rate.

11 Claims, 3 Drawing Figures

ANTI-ALIASING FILTER CIRCUIT FOR OSCILLOSCOPES

BACKGROUND OF THE INVENTION

The present invention relates to an anti-aliasing filter circuit for digital oscilloscopes and particularly to such a circuit which operates in conjunction with the oscilloscope's sweep-rate setting.

Modern digital storage oscilloscopes sample an input signal at a multiplicity of discrete points, and store digital values representative of these points in random access memory. The memory is then read out for portrayal of the stored waveform on the oscilloscope's cathode-ray-tube.

Whatever the sampling rate, it is possible for some of the original analog information to be lost. Moreover, the sampling rate is, in fact, somewhat limited by the maximum storage available in the oscilloscope. The samples may be too far apart, timewise, particularly at slow sweep speeds, for an accurate representation of waveform information to be given across the face of the oscilloscope's cathode-ray-tube. Thus, if the frequency of the input signal information is greater than the Nyquist rate, equal to half the sampling frequency, a waveform presentation may be produced which is very nonrepresentative of the actual input signal. The observed distortion is known as "aliasing".

Aliasing can be avoided by limiting the bandwidth of input so that frequencies greater than half the sampling frequency are filtered out. However, this expedient may limit the frequency range over which the oscilloscope is effective or requires an excessive number of analog filtering devices.

SUMMARY OF THE INVENTION

In accordance with the present invention in a preferred embodiment thereof, a plurality of analog filters are individually selected for high sweep rates, wherein each filter removed frequencies above the Nyquist frequency. For lower sweep rates, a digital transversal filter or finite impulse response filter is utilized and is controlled for varying its pass band in accordance with the oscilloscope sweep rate whereby frequencies above the Nyquist rate are again substantially eliminated. If the digital transversal filter is operative at twice the bandwidth of the oscilloscope, only the digital transversal filter and one analog filter as an input evice need be employed.

It is accordingly an object of the present invention to provide an improved anti-aliasing filter circuit for digital oscilloscopes.

It is another object of the present invention to provide an improved anti-aliasing filter circuit for digital oscilloscopes requiring a minimum number of components.

It is a further object of the present invention to provide an improved anti-aliasing filter circuit for digital oscilloscopes which is controllable for providing the optimum accuracy in waveform presentation.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with accompanying drawings wherein like reference characters refer to like elemens.

DRAWINGS

FIG. 1 is a block diagram of a digital storage oscilloscope utilizing an anti-aliasing circuit according to the present invention, FIG. 2 is a waveform depicting filter impulse response for a digitaal transversal filter employed according to the present invention whichis controlled to provide sixteen sample times between zero crossings, and FIG. 3 is a waveform depicting a second impulse response for a digital transversal filter employed according to the present invention which is controlled to provide eight sample times between zero crossings.

DETAILED DESCRIPTION

Figure 1:
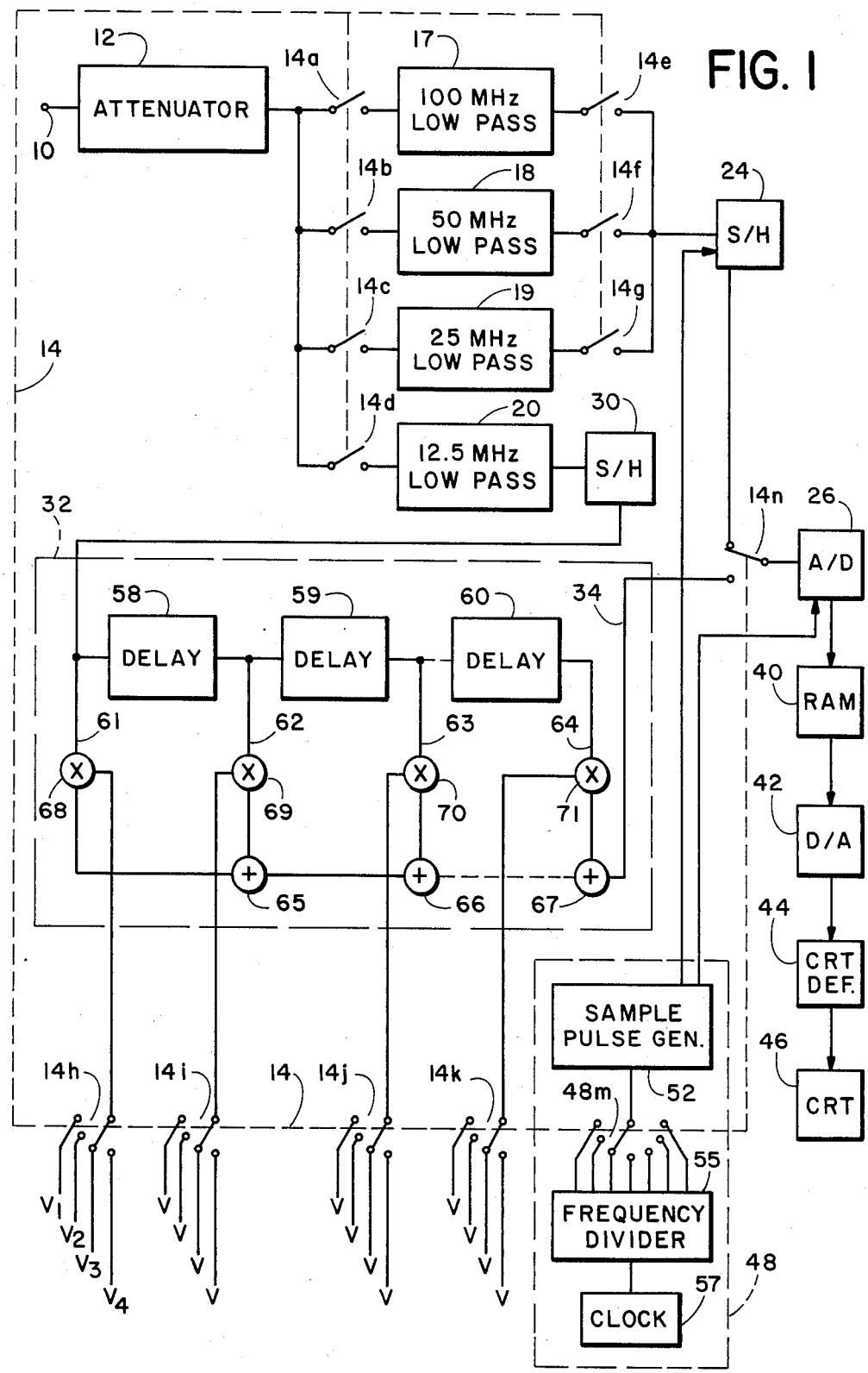

Referring to the drawings and particularly to FIG. 1, a digital storage oscilloscope includes a signal input terminal 10 coupled to an attenuator 12, the output of which is provided to a plurality of switches 14a–d, comprising contacts of sweep rate select switch 14. These switches selectively couple the attenuated input signal to low pass analog filters 17–20. The filters have successively lower frequency pass bands such that the upper cut off frequency of each successive filter is half that of the one before. Thus, the upper frequency of the pass band of filter 17 is approximately 100 megahertz, the upper frequency of filter 18 is approximately 50 megahertz, the upper frequency of filter 19 is approximately 25 megahertz and the upper frequency of filter 20 is approximately 12.5 megahertz. Filters 17–19 are selectively coupled by means of further switches 14e–g to first sample and hold circuit 24, the output of which is applied to analog to digital converter or digitizing circuit 26 via the upper contact of selection switch 14n. Switches 14e–14g and 14n also comprise portions of sweep rate select switch 14.

The output of low pass filter 20 is connected toa second sample and hold circuit 30 which provides the input for digital transversal filter 32, controllable in respect to its frequency pass band as hereinafter more fully described. The output 34 of digital transversal filter 32 is also coupled to the aforementioned switch 14n.

The output of the digitizing means 26 is applied to random access memory 40 for storage of the generated digital values corresponding to samples. These samples are read out and converted to analog values by digital to analog converter 42 for application to deflection means 44 associated with cathode-ray-tube 46. The details of operation of a digital storage oscilloscope are conventional and will not be described.

As will be understood by those skilled in the art, the CRT presentation of a digital storage oscilloscope is limited by the storage capacity of memory 40. Thus, as the analog input at 10 is sampled by circuit 24 via one of the filters 17–19, successive digital numbers corresponding to these samples are stored in memory 40. However, the number of samples taken corresponds to the capacity of memory 40. The number of sample points across the CRT generally remains constant in accordance with memory size, while the sampling rate is made proportional to the sweep rate of the oscilloscope. Thus, at slower sweep rates, the samples are taken farther apart in time, while for faster sweep rates the samples are taken more often, in either case adding up to substantially the same number of samples for the duration of a sweep.

Referring again to FIG. 1, filters 17–20 and 32 are provided for limiting input frequencies to those lower than the Nyquist rate at a given sweep rate. In the present example, the sampling rate of circuit 24, when switches 14a and 14e are closed, is suitably 250 million samples per second. When switches 14b and 14f are closed, the sampling rate of circuit 24 is changed to 125 million samples per second, while the sampling rate of circuit 24 when switches 14c and 14g are closed is 62.5 million samples per second. When switch 14d is operated, an input is provided to the second sample and hold circuit 30 conveniently having a sampling rate of 31.25 million samples per second. The upper cut-off frequency of each of the low pass filters as thus selected is less than half the sampling frequency or sampling rate employed. The sampling rate employed in each instance is dependent upon the sweep rate for the oscilloscope such that a given number of samples will be provided across the screen of the oscilloscope's cathode-ray-tube.

In the present circuit, sample and hold circuit 24 is operated by sample pulse generator 52 comprising a part of time base 48. At the higher frequencies, i.e. above 12.5 megahertz, the sample pulse generator 52 is controlled to bring about the number of samples as above discussed. In particular, sample pulse generator 52 is controlled from sweep rate select switch portion 14m. Sample pulse generator 52 may comprise a multivibrator, the ouput frequency of which is selected by various tapped outputs of frequency divider 55 to which terminals of switch section 14m are connected. Frequency divider 55 successively divides the output of clock 57.

At lower sweep rates, digital transversal filter 32 is selected in place of one of the analog filters and is controllable from sweep rate select switch 14 (sections 14h–14k) so that successively lower pass bands are provided on output lead 34 at successively slower sweep rates. The digital transversal filter 32 suitably comprises an analog delay device, for example a type TAD-32 device manufactured by Reticon Corporation, Sunnyvale, Calif. The device is a bucket brigade analog delay circuit including delay portions 58, 59 and 60 and also comprising a further number of delay portions (not shown) to provide, for example, thirty-two taps in the case of the Reticon device. Taps 62, 63 and 64 as well as input tap 61 are coupled to summing circuits 65, 66 and 67 by way of multipliers 68, 69, 70, and 71. Thus, an output sum is provided on output lead 34 for all the taps inasmuch as each summing circuit is adapted to add the signal from a particular tap to the sum of outputs from prior taps. Alternatively, one summing circuit can be employed which receives the ouput from all of the multipliers.

The filter 32 comprises a transversal or finite impulse response filter, with the signals appearing at each tap being weighted by the multiplier 68–71 before summing. One possible weighting for the tap outputs before summing comprises uniform weighting of all of the taps or a specified number of the taps. The frequency response of the filter is a function of N where N is the number of taps utilized. The frequency response can be controlled by determining the weightings on the taps that contribute to the summed output on lead 34. A preferred weighting of the taps comprises an optimized sin x/x like profile weighting of the taps that is designed to perform low pass filtering.

Figure 2:
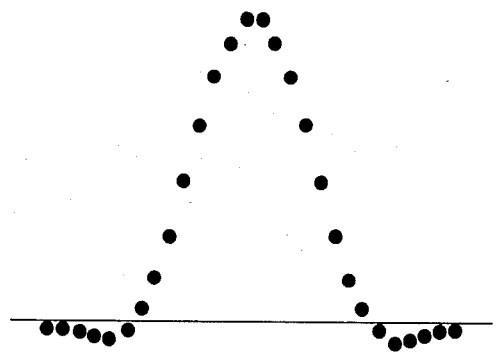
Figure 3:
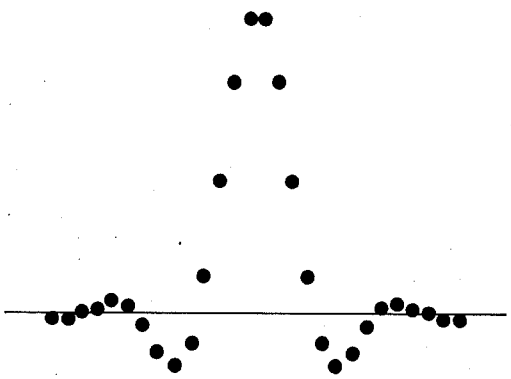

FIG. 2 illustrates the impulse response for filter 32 for a wide "window" where there are sixteen sample times between X-axis zero crossings, while FIG. 3 illustrates the impulse response for a narrow "window" where there are eight sample times between X-axis zero crossings. The narrower impulse response of FIG. 3 corresponds to a wider frequency response, while the wider impulse response of FIG. 2 corresponds to a narrower frequency response. Consequently, the pass band of the digital transversal filter 32 can be decreased by widening th sin x/x weighted profile applied to the multiplier 68–71, and vice versa. Referring to FIG. 1, switch 14 applies different voltages as multiplying factors to the multipliers 68–71 for different sweep rate positions. Thus for switch section 14h, voltages $V_1$, $V_2$, $V_3$, and $V_4$ are the multiplying factors of multiplier 68 for different sweep rates. Likewise the multiplying factors of the other multipliers are changed for different sweep rates to provide different profiles and thus different pass bands.

For further information on digital transversal filters, reference is made to the Proceedings of the 19th Midwest Symposium on Circuits and Systems, Aug. 16–17, 1976, Univ. of Wisconsin, Milwaukee), the papers "A Tapped Analog Delay for Sampled Data Signal Processing" by G. P. Weckler, and "Implementation of Discrete-Time Analog Filter and Processing System", by R. R. Buss and S. C. Tanaka, as well to information made available by the manufacturer of the delay device.

In the particular emobdiment of FIG. 1, sample and hold circuit 30 is operated at a constant rate, e.g. 31.25 million samples per second when operation of filter 32 is selected by closure of switch 14d. This also corresponds to the rate that analog information is shifted along the delay elements 58–60 of filter 32 by shift pulses from a shift circuit (not shown) associated with the delay device. At a given oscilloscope sweep rate, i.e. the highest sweep rate for which filter 32 is selected, a summation from device 67, occurring at each shift pulse, is applied by way of selection switch 14n to digiizer 26 and digitizer 26 in turn stores corresponding digital values in memory 40. Howver, as lower sweep rates are selected by sweep rate selection switch 14, an excessive number of sums will be produced on output lead 34 and consequently only a sufficient number of sums need to be selected for "filling" the screen of the cathode-ray-tube. Sample pulse generator 52, controlled by switch section 14m, generates pulse outputs supplied on line 80 to operate digitizer 26 whereby digitizer 26 provides its output to RAM 40 to select and store every other sample sum, every fourth sample sum, etc., in accordance with the sweep rate so that only a sufficient number of values will be stored even though more are available.

Considering the overall operation of the FIG. 1 circuit, at high sweep rates, switch 14n is in its upper position for selecting the output of one of the filters 17–19 by way of sample and hold circuit 24. Sample and hold cifcuit 24 is operated by sample pulse generator 52 at a rate determined by switch portion 14m for providing a requisite number of samples on the cathode-ray-tube screen in accordance with the selected sweep. At higher sweep rates, the samples are taken more often, time wise. At the highest sweep rate in the particular example, sample and hold circuit 24 takes 250 million samples per second. For this sweep rate, switch contacts 14a and 14e are closed whereby 100 megahertz low pass filter 17 is interposed between attenuator 12 and sample and hold circuit 24, and only frequencies below the Nyquist frequency will then be sampled to avoid the aliasing problem. When the sweep rate is decreased, say by half, and the sampling rate is also decreased to 125 million samples per second, filter 18 is selected instead, and again passes only frequencies that are less than the Nyquist rate. When the sampling rate is again halved, filter 19 is selected.

Rather than including a large multiplicity of analog low pass filters, only one further low pass filter 20 is employed having a top cut off frequency of about 12.5 megahertz, corresponding to the 31.25 million samples per second taken by sample and hold circuit 30. Then for yet lower sampling rates, the parameters of digital transversal filter 32 are adjusted by sweep rate select switch contacts 14h–14k to successively halve the pass band each time the sweep rate is halved. Since more than enough sample sums are produced by digital filter 32 for all sweep rates other than the maximum sweep rate at which it is selected, the output at 34 is decimated by selecting a divided-down number of outputs with A/D converter 26.

Although for purposes of illustration the various multiplying factors for multipliers 69–71 are shown as selected by means of the selection of multiplying voltages, in the actual delay line device as manufactured by Reticon, separate resistors or potentiometers may be selected for bringing about different multiplying factors. To bring about the weighting of the ouput of each of the taps 61–64 before summing, whether the weighting is uniform over a selected number of taps in accordance with the frequency pass band desired, or whether the weighting describes a tapered sin x/x characteristic, different resistor values may thus be selected in each case for providing a pass and appropriate at different sweep rates to eliminate input frequencies above the Nyquist rate.

In some cases, the plurality of analog filters 17–19 may not be required, e.g. when the sampling rate and pass band desired are sufficiently low that digital filter 32 can accomplish the desired filtering. Thus, if a transversal filter can operate at twice the oscilloscope bandwidth, only the digital transversal filter and one analog filter (20) will be required. However, a digital filter can have frequency limitations relating to speed of multiplication and summation. Therefore, in accordance with the described embodiment of the present invention, the digital filter is employed at "slower" sampling rates, e.g. 31.25 million samples per second and below, while a smaller number of analog filters 17–19 are employed to prevent aliasing at the faster sampling rates.

In accordance wih the present invention, theefore, aliasing is substantially eliminated at all sampling rates without incurring the expense of a very large number of analog filters. With the bandlimiting of signals at all sweep settings, an arbirary waveform may be applied to the oscilloscope and a predictable and consistent result will aways be displayed. Also, since the signal is always bandlimited, further signal processing may be performed, e.g. interpolation, without producing ringing and overshoot on square waves.

In the present specification and claims, the selection of sweep rate in the oscilloscope refers to the time base setting ordinarily under operator control.

While I have shown and described a prefered embodiment of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. An anti-aliasing filter circuit for a digital oscilloscope having a controllable sweep-rate and including digitizing means for converting an analog signal to digital values for storage in said digital oscilloscope, said circuit comprising:

means for providing a signal input, a plurality of low pass analog filters for receiving said signal input, a digital filter for receiving said signal input, said digital filter having an electrically controllable pass band, and means for controlling the sweep-rate of said oscilloscope simultaneously with selection of signal outputs of said analog filters at higher sweep-rates and selection of the signal output of said digital filter at slower sweep-rates for coupling to said digitizing means while controlling the pass band of said digital filter at slower sweep rates in order to pass selected frequencies less than half the sampling rate of said digitizing means.

2. The circuit according to claim 1 wherein said digital filter comprises a tapped analog delay device producing an output summed from the taps thereof and is controllable by means of selectively weighting the outputs of individual taps.

3. The circuit according to claim 2 wherein the weighting of a group of said taps describe a tapered sin x/x profile.

4. An anti-aliasing filter circuit for a digital oscilloscope having a sweep-rate control and including digitizing means for converting an analog signal to digital values for storage in said digital oscilloscope, said circuit comprising:

a signal input terminal, a plurality of low pass filters having different bandwidths and means for coupling the input of each of said filters to said signal input terminal, and means for selecting the ouput of one of said filters and for coupling the selected output to said digitizing means in accordance with the sweep rate control of said oscilloscope so that the pass band is reduced at lower sweep and sampling rates to selected frequencies less than half the sampling rate of said digitizing means.

5. An anti-aliasing filter circuit for a digital oscilloscope having a sweep-rate control and including digitizing means for converting an analog signal to digital values for storage in said digital oscilloscope, said circuit comprising:

a digital transversal filter including a tapped analog delay device providing an output summed at the taps thereof, and means for coupling said digital transversal filter to receive a signal input, wherein parameters of said digital transversal filter are selected in response to the setting of the sweep rate control of said oscilloscope to provide a reduced low pass characteristic substantially in proportion to lowering of the sweeep rate in order to pass selected frequencies less than half the sampling rate of said digitizing means.

6. The circuit according to claim 5 wherein said parameters of said digital transversal filter comprise weighting factors applied to at least ones of said taps to provide a selected pass band.

7. The circuit according to claim 6 wherein the weighting factors applied to a group of said taps describe a tapered sin x/x profile.

8. An anti-aliasing filter circuit for a digital oscilloscope having a sweep-rate control and including digitizing means for converting an analog signal to digital values for storage in said digital oscilloscope, said circuit comprising:

a signal input terminal, a plurality of low pass analog filters having different bandwidths and means for coupling the input of each of said analog filters to said signal input terminal, a low pass digital transversal filter and means for coupling the input of said digital transversal filter to said signal input terminal, and means for selecting between the ouput of one of said analog filters and the output of said digital transversal filter and for coupling the selected output to said digitizing means in accordance with the setting of the sweep rate control of said oscilloscope including providing the output of one of said analog filters as a digitizing input at faster sweep rates wherein the selected output is sampled at a higher sampling rate, and providing the output of said digital transversal filter as a digitizing input at slower sweep rates wherein the selected output is sampled at a lower sampling rate, said digital transversal filter being responsive to a particular selected slower sweep rate for setting the parameters of said digital transversal filter to provide a diminshed pass band as said sweep rate and sampling rate are reduced in order to prevent aliasing in the presentation of an input signal waveform by said oscilloscope.

9. The circuit according to claim 8 wherein said means for selectively coupling the input of said digital transversal filter to said signal input terminal comprises an analog filter having a lower pass band than any of said plurality of low pass analog filters, and means for sampling the output of the last mentioned analog filter at a predetermined rate to provide an input for said digial transversal filter corresponding to the shift rate of said digital transversal filter.

10. The circuit according to claim 8 wherein said digital transversal filter comprises a tapped analog delay device providing an output summed from the taps thereof and wherein the said parameters of said digital transversal filter comprise selected weighting factors applied to at least ones of said taps to provide a selected pass band.

11. The circuit according to claim 10 wherein the weighting factors applied to a group of said taps describe a tapered sin x/x profile.

* * * * *